United States Patent
Littrell

(10) Patent No.: US 11,726,105 B2
(45) Date of Patent: *Aug. 15, 2023

(54) PIEZOELECTRIC ACCELEROMETER WITH WAKE FUNCTION

(71) Applicant: QUALCOMM Technologies, Inc., San Diego, CA (US)

(72) Inventor: Robert J. Littrell, Boston, MA (US)

(73) Assignee: QUALCOMM Incorporated, San Diego, CA (US)

( * ) Notice: Subject to any disclaimer, the term of this patent is extended or adjusted under 35 U.S.C. 154(b) by 302 days.

This patent is subject to a terminal disclaimer.

(21) Appl. No.: 16/900,185

(22) Filed: Jun. 12, 2020

(65) Prior Publication Data

US 2020/0408799 A1    Dec. 31, 2020

Related U.S. Application Data

(60) Provisional application No. 62/866,713, filed on Jun. 26, 2019.

(51) Int. Cl.
*G01P 15/09* (2006.01)
*G01P 1/00* (2006.01)
(Continued)

(52) U.S. Cl.
CPC ............. *G01P 15/09* (2013.01); *G01P 1/00* (2013.01); *H04R 17/00* (2013.01); *H04R 19/04* (2013.01);
(Continued)

(58) Field of Classification Search
CPC .......... G01P 15/09; G01P 1/00; H04R 19/04; H04R 17/00; H01L 41/04; H01L 41/042;
(Continued)

(56) References Cited

U.S. PATENT DOCUMENTS 3,636,463 A   1/1972  Ongkiehong
4,991,145 A   2/1991  Goldstein et al.
(Continued)

FOREIGN PATENT DOCUMENTS

CN   103019373   4/2013
CN   104050973   9/2014
(Continued)

OTHER PUBLICATIONS

CN Office Action in Chinese Appln. No. 201780026345.6, dated May 20, 2020, 29 pages (with English Translation).
(Continued)

*Primary Examiner* — Helen C Kwok
(74) *Attorney, Agent, or Firm* — Polsinelli Qualcomm Incorporated

(57) ABSTRACT

A sensor device that senses proper acceleration. The sensor device includes a substrate, a spacer layer supported over a first surface of the substrate, at least a first tapered cantilever beam element having a base and a tip, the base attached to the spacer layer, and which is supported over and spaced from the substrate by the spacer layer. The at least first tapered cantilever beam element tapers in width from the base portion to the tip portion. The at least first cantilever beam element further including at least a first layer comprised of a piezoelectric material, a pair of electrically conductive layers disposed on opposing surfaces of the first layer, and a mass supported at the tip portion of the at least first tapered cantilever beam element.

22 Claims, 11 Drawing Sheets

(51) Int. Cl.
  *H10N 30/30* (2023.01)
  *H04R 19/04* (2006.01)
  *H04R 17/00* (2006.01)

(52) U.S. Cl.
  CPC ......... *H10N 30/302* (2023.02); *H10N 30/306* (2023.02); *H04R 2201/003* (2013.01)

(58) Field of Classification Search
  CPC ............ H01L 41/0477; H01L 41/1132; H01L 41/1136; H01L 41/047; H01L 41/0926; H01L 41/094; H01N 30/302; H01N 30/306; H01N 30/802; H01N 30/853; H01N 30/877
  See application file for complete search history.

(56) References Cited

U.S. PATENT DOCUMENTS

| | | | |
|---|---|---|---|
| 5,036,856 | A | 8/1991 | Thornton |
| 5,263,491 | A | 11/1993 | Thornton |
| 5,323,141 | A | 6/1994 | Petek |
| 5,640,086 | A | 6/1997 | Rentsch et al. |
| 5,644,308 | A | 7/1997 | Kerth et al. |
| 6,243,595 | B1 | 6/2001 | Lee et al. |
| 6,909,221 | B2 | 6/2005 | Ayazi et al. |
| 7,948,153 | B1* | 5/2011 | Kellogg ............... H01L 41/1136 310/329 |
| 8,896,184 | B2 | 11/2014 | Grosh et al. |
| 9,052,332 | B2 | 6/2015 | Huang et al. |
| 9,425,818 | B1 | 8/2016 | Rajaee et al. |
| 9,445,173 | B2 | 9/2016 | Wiesbauer et al. |
| 9,799,337 | B2 | 10/2017 | Chang et al. |
| 9,964,433 | B2 | 5/2018 | Du et al. |
| 10,001,391 | B1* | 6/2018 | Littrell ................... G01H 13/00 |
| 10,028,054 | B2 | 7/2018 | Furst et al. |
| 10,524,082 | B1 | 12/2019 | Carroll et al. |
| 10,715,922 | B2 | 7/2020 | Littrell et al. |
| 2003/0042117 | A1* | 3/2003 | Ma ....................... H01H 59/0009 200/181 |
| 2003/0179888 | A1 | 9/2003 | Burnett et al. |
| 2006/0015287 | A1 | 1/2006 | Vock et al. |
| 2006/0195164 | A1 | 8/2006 | Sondergaard et al. |
| 2007/0129941 | A1 | 6/2007 | Tavares |
| 2010/0039923 | A1 | 2/2010 | Kim et al. |
| 2011/0142261 | A1 | 6/2011 | Josefsson |
| 2011/0233693 | A1* | 9/2011 | Perruchot ............ H01L 41/0933 257/417 |
| 2012/0026716 | A1 | 2/2012 | Bauer et al. |
| 2012/0087521 | A1 | 4/2012 | Delaus et al. |
| 2012/0250909 | A1* | 10/2012 | Grosh ..................... H01L 41/27 381/174 |
| 2012/0299937 | A1 | 11/2012 | Brown et al. |
| 2013/0101128 | A1 | 4/2013 | Lunner et al. |
| 2013/0110521 | A1 | 5/2013 | Hwang et al. |
| 2013/0132095 | A1 | 5/2013 | Murthi et al. |
| 2013/0195288 | A1 | 8/2013 | Ye |
| 2013/0223635 | A1 | 8/2013 | Singer et al. |
| 2013/0301101 | A1* | 11/2013 | Conrad ............... G02B 26/0825 359/291 |
| 2013/0322215 | A1 | 12/2013 | Du et al. |
| 2014/0003630 | A1 | 1/2014 | Demiya et al. |
| 2014/0270197 | A1 | 9/2014 | Krishnamurthy et al. |
| 2014/0270259 | A1 | 9/2014 | Goertz et al. |
| 2014/0363010 | A1 | 12/2014 | Christopher et al. |
| 2015/0049884 | A1 | 2/2015 | Ye |
| 2015/0173672 | A1 | 6/2015 | Goldstein |
| 2015/0208165 | A1 | 7/2015 | Volk et al. |
| 2015/0215698 | A1 | 7/2015 | Haiut |
| 2015/0249881 | A1 | 9/2015 | Ruan et al. |
| 2015/0256914 | A1 | 9/2015 | Wiesbauer et al. |
| 2015/0271606 | A1* | 9/2015 | Grosh ..................... H04R 31/003 216/13 |
| 2015/0350774 | A1 | 12/2015 | Furst et al. |
| 2015/0350792 | A1* | 12/2015 | Grosh .................... B81B 7/0032 257/416 |
| 2016/0066113 | A1 | 3/2016 | Elkhatib et al. |
| 2016/0287870 | A1 | 10/2016 | Yip et al. |
| 2016/0314805 | A1 | 10/2016 | Mortazavi et al. |
| 2017/0150254 | A1 | 5/2017 | Bakish et al. |
| 2017/0214968 | A1 | 7/2017 | Braithwaite et al. |
| 2017/0223450 | A1 | 8/2017 | Paton Alvarez et al. |
| 2017/0238106 | A1 | 8/2017 | Theill |
| 2017/0245076 | A1 | 8/2017 | Kusano et al. |
| 2018/0324518 | A1 | 11/2018 | Dusan et al. |
| 2018/0352356 | A1 | 12/2018 | Amir |
| 2019/0098417 | A1 | 3/2019 | Littrell et al. |
| 2020/0018729 | A1 | 1/2020 | Fumikura et al. |
| 2020/0296513 | A1 | 9/2020 | Littrell et al. |
| 2020/0296530 | A1 | 9/2020 | Littrell et al. |
| 2020/0336841 | A1 | 10/2020 | Zeleznik et al. |
| 2021/0193901 | A1* | 6/2021 | Umezawa ........... H01L 41/0477 |
| 2022/0308084 | A1 | 9/2022 | Littrell |
| 2022/0317148 | A1 | 10/2022 | Littrell |
| 2022/0344571 | A1 | 10/2022 | Littrell |

FOREIGN PATENT DOCUMENTS

| | | |
|---|---|---|
| CN | 203882609 | 10/2014 |
| CN | 104918178 | 9/2015 |
| JP | 2015206974 | 11/2015 |
| KR | 1020140036790 | 3/2014 |
| WO | WO 2017151650 | 9/2017 |

OTHER PUBLICATIONS

CN Search Report in Chinese Appln. No. 201780026345.6, dated May 11, 2020, 2 pages.

Extended European Search Report in European Application No. 17760637.3, dated Jul. 23, 2019, 8 pages.

Freedman et al., "An Analog VLSI Implementation of the Inner Hair Cell and Auditory Nerve Using a Dual AGC Model," IEEE Transactions on Biomedical Circuits and Systems, Apr. 2014, 8(2):240-256.

PCT International Preliminary Report on Patentability in International Appln. No. PCT/US2017/019996, dated Sep. 4, 2018, 13 pages.

PCT International Search Report and Written Opinion in International Appln. No. PCT/US2017/019996, dated May 11, 2017, 15 pages.

PCT International Search Report and Written Opinion in International Appln. No. PCT/US2020/022932, dated Jun. 18, 2020, 13 pages.

PCT International Search Report and Written Opinion in International Appln. No. PCT/US2020/022973, dated Jun. 12, 2020, 11 pages.

PCT International Search Report and Written Opinion in International Appln. No. PCT/US2020/039746, dated Nov. 20, 2020, 2020, 11 pages.

EP Office Action in European Application No. 17760637.3, dated Sep. 8, 2020, 5 pages.

CN Office Action in Chinese Appln. No. 201780026345.6, dated Mar. 18, 2021, 18 pages (with English translation).

Synopsys, Inc. "Synopsys and Sensory, Inc. Deliver Ultra-Low Power Voice Control Solution for Mobile, Automotive and Consumer Applications," 2015, 3 pages.

head-fi.org [online], "Anetode, Headphone Reviews," 2011, retrieved on Apr. 23, 2021, retrieved from URL <https://www.head-fi.org/threads/why-does-it-matter-if-headphones-have-a-frequency-range-below-20hz-and-above-20khz.582802/> ,1-6.

International Search Report and Written Opinion in International Appln. No. PCT/US2022/71834, dated Jun. 29, 2022, 11 pages.

* cited by examiner

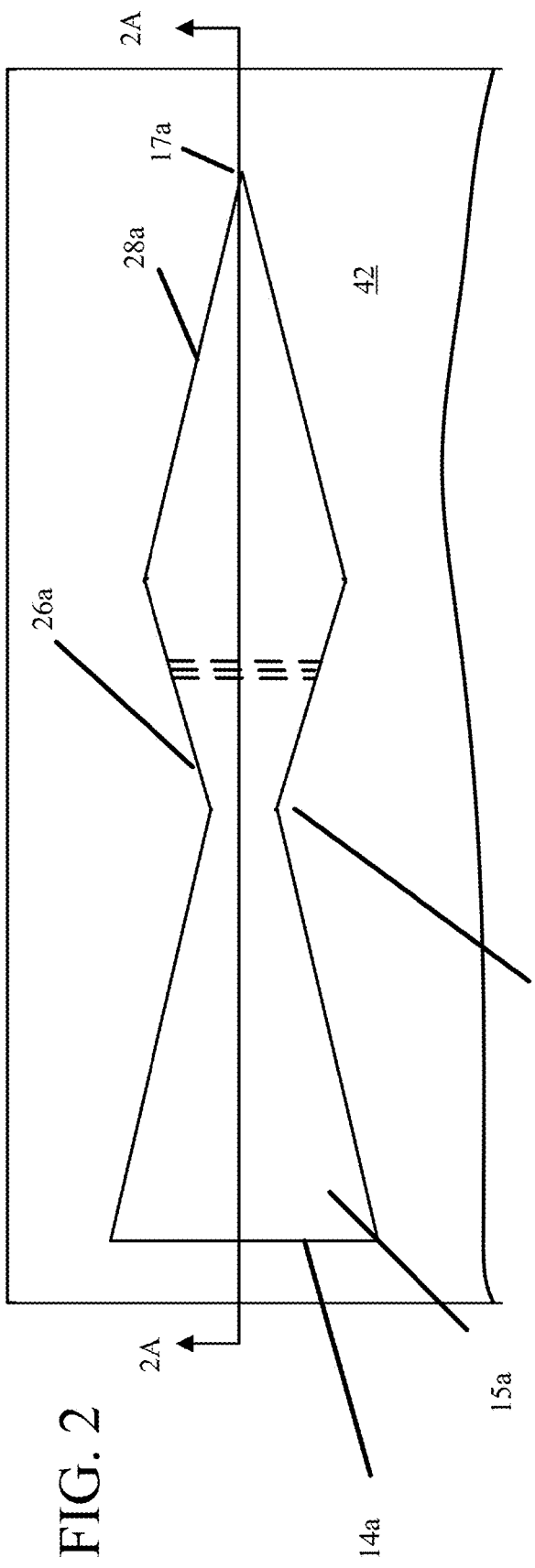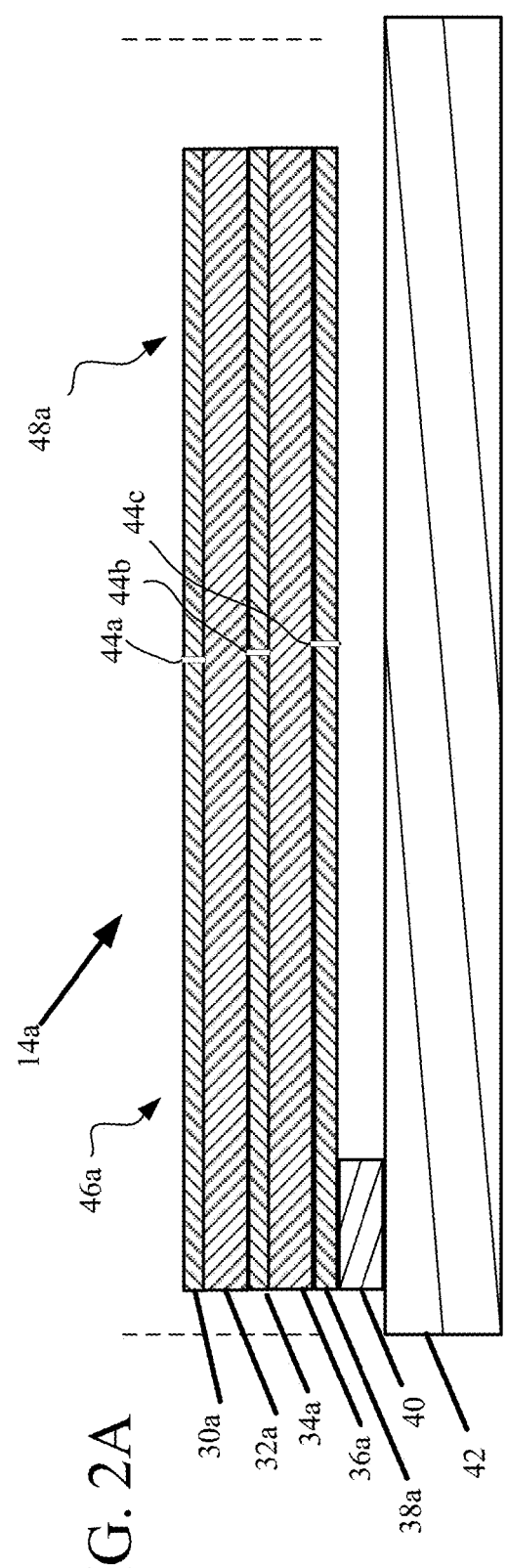

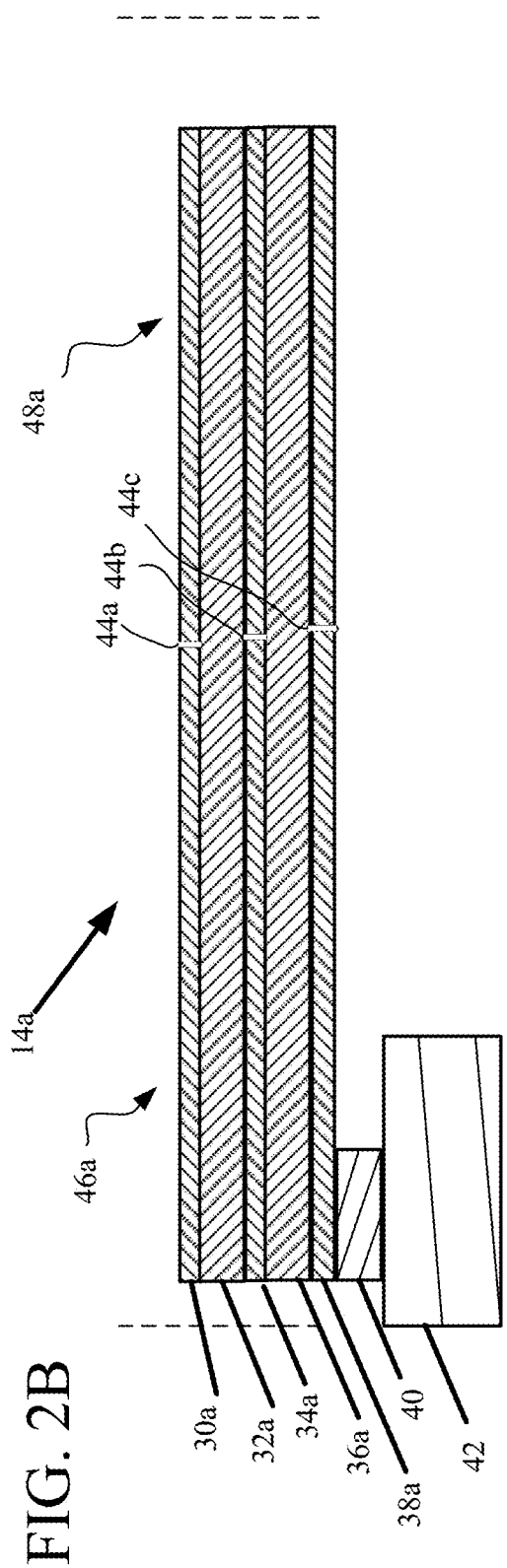

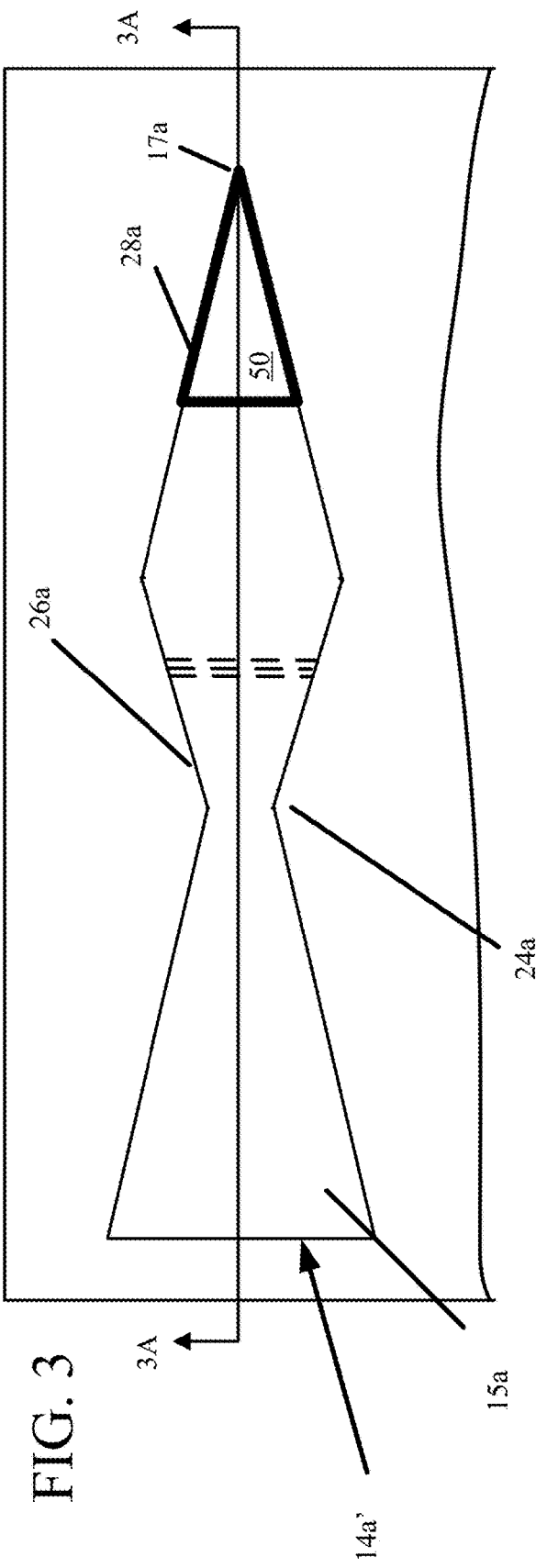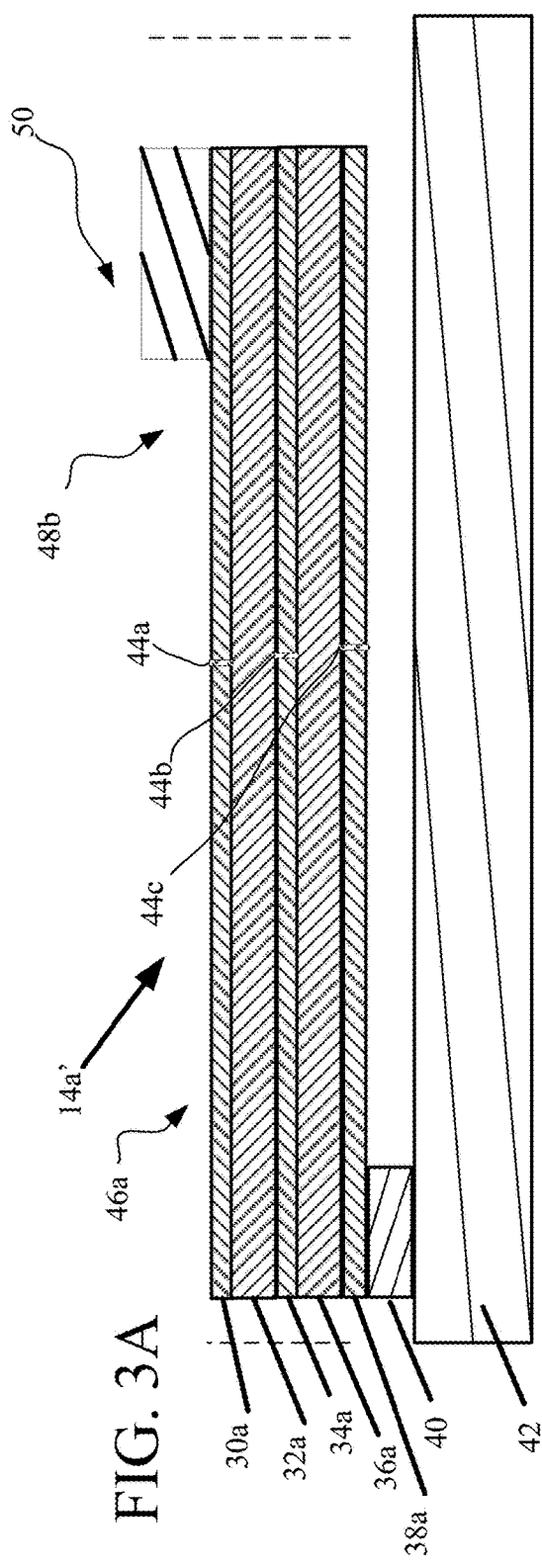

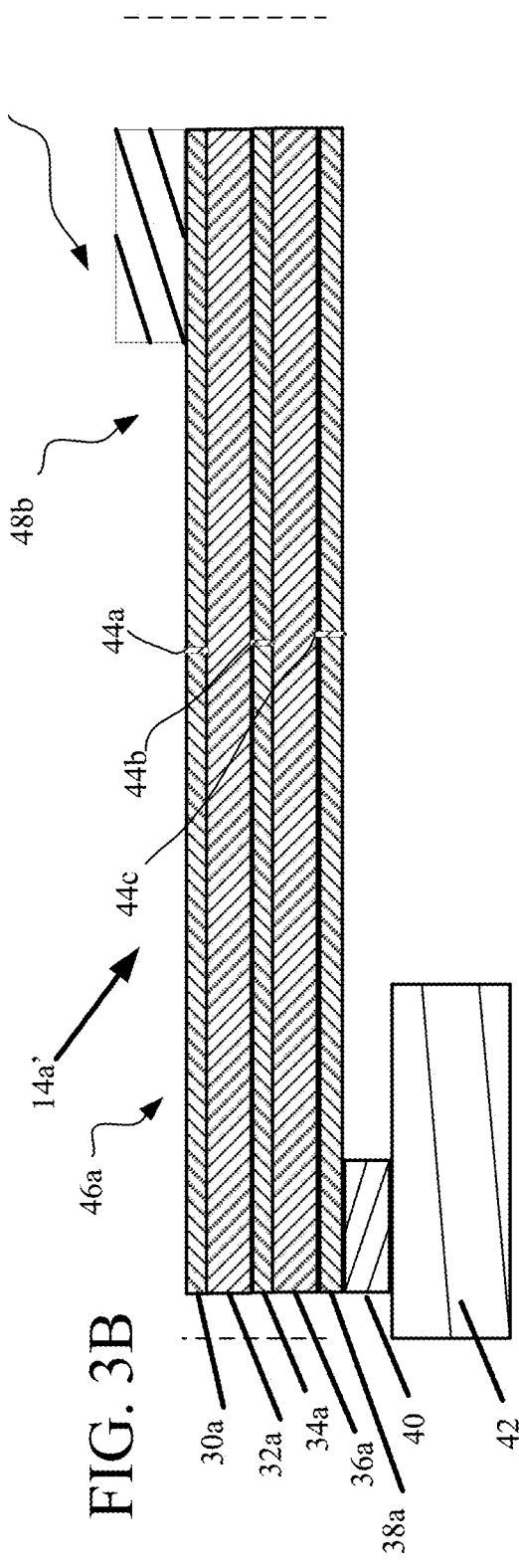
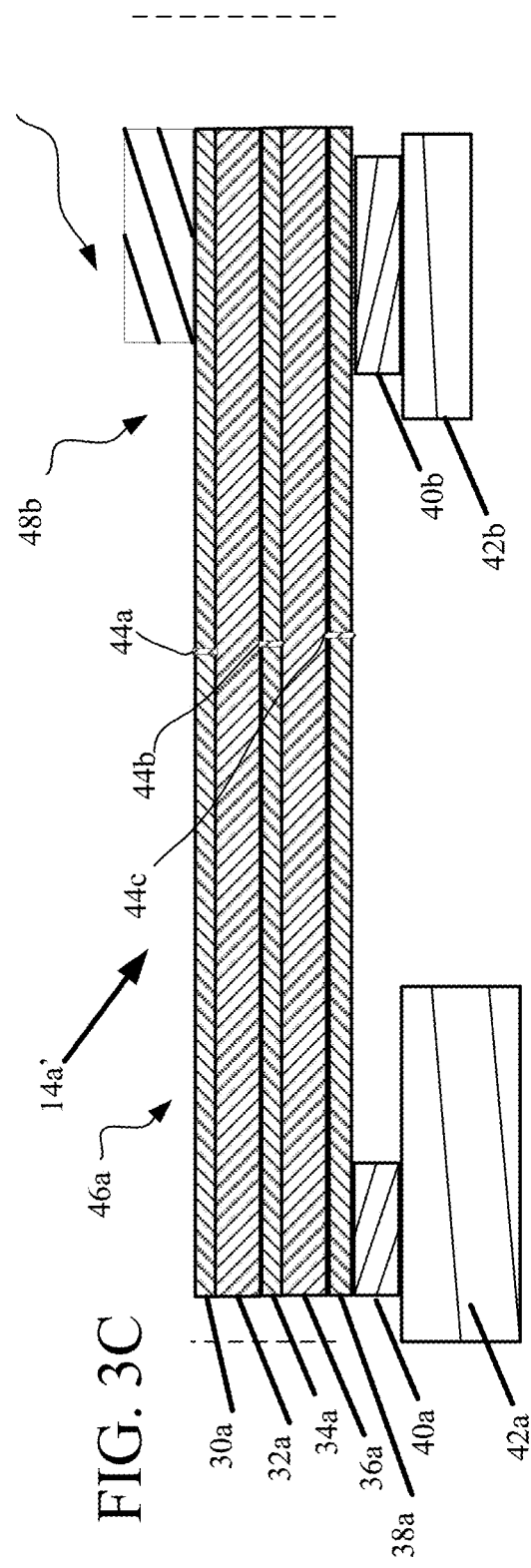

PIEZOELECTRIC ACCELEROMETER WITH WAKE FUNCTION

CLAIM OF PRIORITY

This application claims priority under 35 USC § 119(e) to U.S. Provisional Patent Application Ser. No. 62/866,713, filed on Jun. 26, 2019, and entitled "Piezoelectric Accelerometer with Wake Function," the entire contents of which are hereby incorporated by reference.

BACKGROUND

This invention relates to accelerometers that measure proper acceleration, the acceleration of a body in its own instantaneous rest frame, and in particular voice accelerometers.

Piezoelectric and capacitive accelerometers are well known. Capacitive accelerometers are a type of accelerometer that uses capacitive sensing to measure proper acceleration and is generally considered as the primary technology used in many markets and devices such as consumer electronics, automotive air bag sensors, navigation systems, gaming devices, etc. Piezoelectric accelerometers, on the other hand, have less applications while still having unique advantages over capacitive accelerometers. Piezoelectric accelerometers use the "piezoelectric effect" of a piezoelectric material to measure dynamic changes in proper acceleration.

Some of the advantages of piezoelectric accelerometers include being insensitive to dust and particles and being able to output a signal without the need for a bias voltage applied to the piezoelectric element. Another advantage of piezoelectric sensor elements is that the elements can have a relatively large dynamic range because the elements are not limited by either a capacitive gap size or an overlap of interdigitated elements.

SUMMARY

Some of the advantages of piezoelectric accelerometers make piezoelectric accelerometers ideal for specific applications. Because piezoelectric accelerometers are relatively insensitive to dust and particles, piezoelectric accelerometers can be packaged with other devices such as sensors that are exposed to real-world environments. In addition, because a piezoelectric accelerometer outputs a signal without the need for a bias voltage applied to the piezoelectric element, piezoelectric elements are ideal for use as wake-up sensors.

One challenge with optimizing a piezoelectric accelerometer involves mechanical shock.

The typical accelerometer device used in consumer electronics, military, or automotive systems may experience relatively high mechanical shock levels, typically of 10,000 g or more, where "g" is standard acceleration due to gravity (9.8 m/s$^2$ or 32.17405 ft./s$^2$). Because piezoelectric sensors produce output signals that are nearly linear, a shock of 10,000 g will impart about 10,000 times the stress into the piezoelectric material of the piezoelectric element, as an acceleration of 1 g.

On the other hand, the piezoelectric material has a given material strength, i.e., so called "ultimate strength," i.e., the maximum stress that a material can withstand while being stretched or pulled before the material will fracture. Therefore, in a piezoelectric element that is used in a piezoelectric accelerometer, an applied stress to the material directly produces a output voltage signal. Thus, in a linear device such as piezoelectric accelerometer, there is an inherent trade-off between output signal and mechanical shock survivability.

According to an aspect, a sensor device includes a substrate, a spacer layer supported over a first surface of the substrate, at least a first tapered cantilever beam element having a base and a tip, the base attached to the spacer layer, and which at least first tapered cantilever beam element is supported over and spaced from the substrate by the spacer layer, with the at least first tapered cantilever beam element tapering in width from the base portion to the tip portion, and with the at least first cantilever beam element including at least a first layer comprised of a piezoelectric material and a pair of electrically conductive layers disposed on opposing surfaces of the first layer.

Some of the features that can be included in the above aspect can be one or more or a combination of the following features or other features disclosed below.

The piezoelectric material is aluminum nitride or lead zirconate titanate or scandium-doped aluminum nitride. The substrate is silicon, the spacer is silicon dioxide and the pair of electrically conductive layers are comprised of a refractory metal.

The at least first layer of piezoelectric material and the at least first pair of electrically conductive layers are a plurality of layers of piezoelectric material and a plurality of electrically conductive layers disposed on opposing surfaces of the plurality of piezoelectric layers, and which plurality of layers of piezoelectric material and plurality of electrically conductive layers are arranged in a stack. The tapered cantilever beam element is configured to have the base region taper to an intermediate neck region and from the intermediate neck region expand to a wide intermediate region and from the wide intermediate region taper to the tip portion, and has an electrical discontinuity in the electrically conductive layers to provide an electrically active portion of the tapered cantilever beam element and an electrically inactive portion of the tapered cantilever beam element.

The sensor device includes plural cantilever beam elements that includes the first tapered cantilever beam element and a plurality of mass elements supported at the tip portions of the cantilever beam elements wherein the mass is supported on the electrically inactive portion of the tapered cantilever beam element.

The at least first tapered cantilever beam element is a plurality of tapered cantilever beam elements arranged in a close-packed area by interdigitating the plurality of tapered cantilever beam elements. Each of the plurality of tapered cantilever beam elements has an electrical discontinuity in at least one of the pair of electrically conductive layers to provide an electrically active portion and an electrically inactive portion.

Each of the plurality of tapered cantilever beam elements has a mass element, with the mass element supported on the electrically inactive portion of the tapered cantilever beam element. The sensor device includes plural cantilever beam elements that includes the first tapered cantilever beam element and a single mass supported on the electrically inactive portion of the plural tapered cantilever beam elements.

The tapered cantilever beam element has the wide base region that is attached to the spacer, which base region tapers to a narrow neck region, from the narrow neck down region the width of the cantilever beam element widens to a wide region, and from the wide region, the tapered cantilever beam element narrows to the tip portion. Each of the plurality of tapered cantilever beam elements has a wide base region that is attached to the spacer, which base region tapers to a narrow neck region, from the narrow neck down region the width of the cantilever beam element widens to a wide region, and from the wide region, the tapered cantilever beam elements narrows to the tip. The sensor device further includes a plurality of tapered cantilever beam elements including the first tapered cantilever beam element, with the plurality of tapered cantilever beam elements arranged in a close-packed area, and with each of the cantilever beam elements comprising at least the first layer of piezoelectric material, the pair of electrically conductive layers; and each further including a mass supported at the tip portion of the tapered cantilever beam element.

Each of the plurality of tapered cantilever beam elements has a wide base region that is attached to the spacer, which base region tapers to a narrow neck region, from the narrow neck down region the width of the cantilever beam element widens to a wide region, and from the wide region, the tapered cantilever beam elements narrows to the tip. The plurality of tapered cantilever beam elements are electrically connected in series with each.

According to an additional aspect, a voice accelerometer device includes a sensor device having a bandwidth of at least 1 kHz to produce an output signal and a detector circuit configured to receive the output signal from the sensor device and produce an output signal.

Some of the features that can be included in the above aspect can be one or more or a combination of the following features or other features disclosed below.

The voice accelerometer wherein the sensor device includes a substrate, a spacer layer supported over a first surface of the substrate, at least a first tapered piezoelectric cantilever beam element having a base portion that is supported over the substrate and spaced from the substrate by the spacer layer, with the piezoelectric material being aluminum nitride or lead zirconate titanate or scandium-doped aluminum nitride, and the substrate being silicon, the spacer being silicon dioxide and the pair of electrically conductive layers comprised of a refractory metal.

The at least first tapered cantilever beam element tapers in width from the base portion to a tip portion, and with the cantilever beam element including at least a first piezoelectric layer, a pair of electrically conductive layers disposed on opposing surfaces of the first piezoelectric layer. The at least first layer of piezoelectric material and the at least first pair of electrically conductive layers are a plurality of layers of piezoelectric material and a plurality of electrically conductive layers disposed on opposing surfaces of the plurality of piezoelectric layers, and which plurality of layers of piezoelectric material and plurality of electrically conductive layers are arranged in a stack.

The tapered cantilever beam element has an electrical discontinuity in at least one of the pair of electrically conductive layers to provide an electrically active portion of the tapered cantilever beam element and an electrically inactive portion of the tapered cantilever beam element. The voice accelerometer further includes a mass supported at the tip portion of the at least first tapered cantilever beam element, with the mass supported on the electrically inactive portion of the tapered cantilever beam element.

The at least first tapered cantilever beam element is a plurality of tapered cantilever beam elements arranged in a close-packed area by interdigitating the plurality of tapered cantilever beam elements, and with each of the plurality of tapered cantilever beam elements having an electrical discontinuity in at least one of the pair of electrically conductive layers to provide an electrically active portion and an electrically inactive portion. Each of the plurality of tapered cantilever beam elements has a mass element supported on the electrically inactive portion of the tapered cantilever beam element.

According to an additional aspect, a packaged micro electromechanical system (MEMS) device includes a MEMS device including a package having a compartment; and a MEMS die disposed in the compartment, the MEMS die supporting a MEMS accelerometer and a MEMS microphone.

Some of the features that can be included in the above aspect can be one or more or a combination of the following features or other features disclosed below.

The packaged MEMS device further includes a circuit coupled to an output of the MEMS accelerometer and an output of the MEMS microphone, with the circuit functioning to combine output signals from the MEMS accelerometer and the MEMS microphone into a single, combined output signal. The packaged MEMS device further includes a first band-pass filter coupled to the output of the MEMS accelerometer and a second band-pass filter coupled to the output of the MEMS microphone.

The first band-pass filter has cut-off frequencies of about 100 Hz and 2000 Hz; and the second band-pass filter has cut-off frequencies of about 2000 Hz and 8000 Hz. The packaged MEMS device further includes a first amplifier coupled to the first band-pass filter that provides signal gain to the signal from the first band-pass filter and a second amplifier coupled to the second band-pass filter that provides signal gain to the signal from the second band-pass filter.

The packaged MEMS device further includes a circuit that combines the signals from the first and second amplifier into a single output signal. The packaged MEMS device senses both acceleration and sound produced by a user's voice. The packaged MEMS a pair of earbuds, with the MEMS accelerometer used to sense vibrations from the vocal cords and the MEMS microphone used to sense acoustic sound through the air.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 2 is a plan view of a piezoelectric element disposed in the piezoelectric accelerometer sensor device of FIG. 1.

FIG. 2A is a cross-sectional view of the piezoelectric element of FIG. 2, taken along line 2A-2A of FIG. 2.

FIG. 2B is the cross-sectional view of FIG. 2 showing an alternative implementation.

FIG. 3 is a plan view of an alternative piezoelectric element in the piezoelectric accelerometer of FIG. 1.

FIG. 3A is a cross-sectional view of the alternative piezoelectric element of FIG. 3, taken along line 3A-3A of FIG. 3.

FIGS. 3B and 3C are the cross-sectional view of FIG. 3 showing alternative implementations.

DETAILED DESCRIPTION

Piezoelectric devices have an inherent ability to be actuated by stimulus even in the absence of a bias voltage due to the so called "piezoelectric effect" that cause a piezoelectric material to segregate charges and provide a voltage potential difference between a pair of electrodes that sandwich the piezoelectric material. This physical property enables piezoelectric devices to provide ultra-low power detection of a wide range of stimulus signals.

Micro Electro-Mechanical Systems (MEMS) can include piezoelectric devices and capacitive devices. Accelerometers fabricated as capacitive devices require a charge pump to provide a polarization voltage, whereas piezoelectric devices such as piezoelectric accelerometers do not require a charge pump. The charge generated by the piezoelectric effect is generated due to stimulus causing mechanical stress in the material. As a result, ultra-low power circuits can be used to transfer this generated charge through simple gain circuits.

Figure 1:
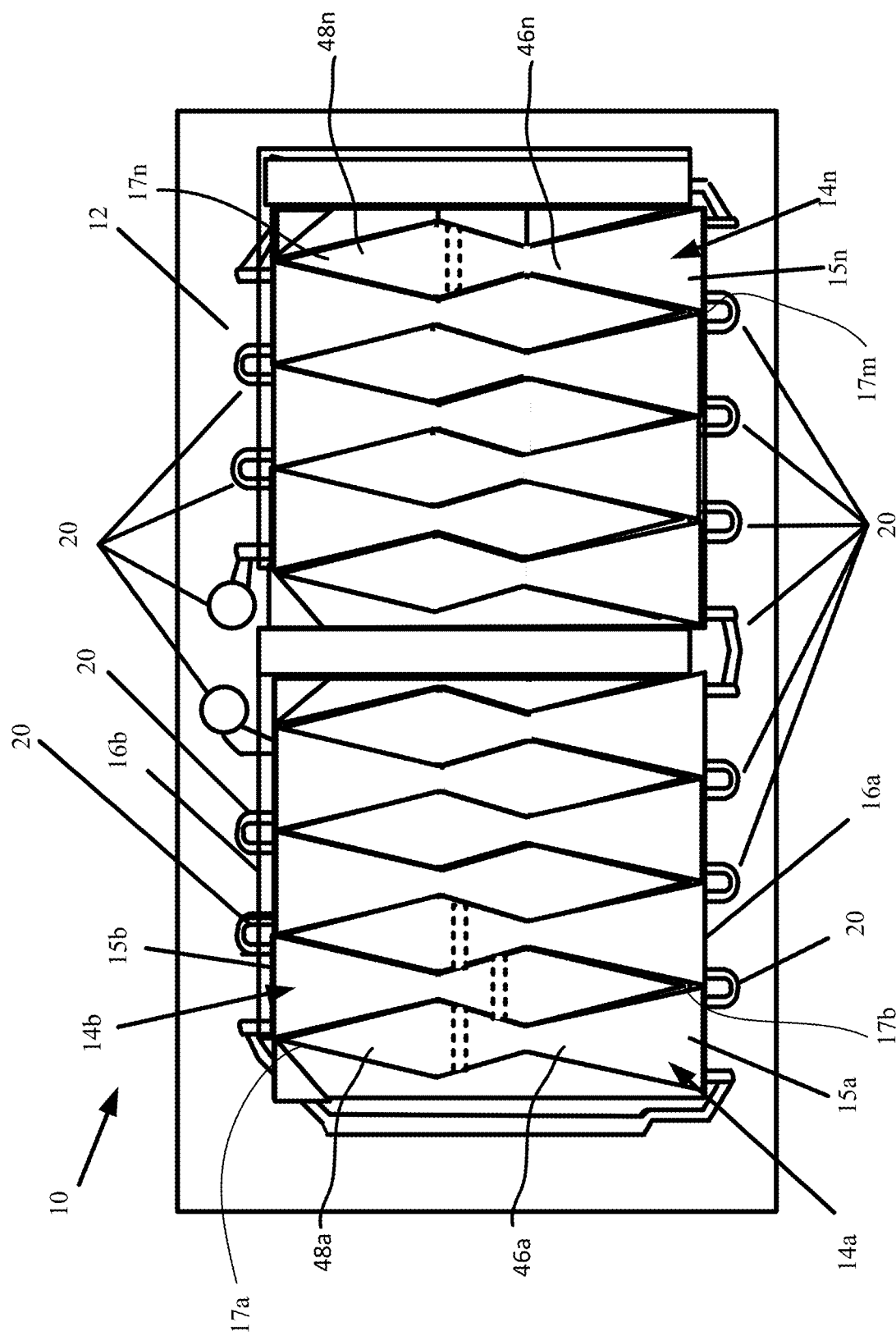
FIGS. 1 and 1A are plan views of an exemplary piezoelectric accelerometer sensor device.

Referring now to FIG. 1, a piezoelectric accelerometer sensor device 10 includes a piezoelectric sensor element 12 as shown. In FIG. 1, the piezoelectric sensor element 12 has a plurality of tapered cantilever beam elements 14a-14n. The tapered cantilever beam elements 14a-14n have respective base portions 15a-15n and tip portions 17a-17n. The tapered cantilever beam elements 14a-14n are closely packed into a defined area by interdigitating successive ones of the tapered cantilever beam elements 14a-14n.

In this embodiment of the accelerometer 10 the piezoelectric sensor element 12 includes 14 interdigitated cantilevers elements 14a-14n. A greater or lesser number of cantilever beam elements can be provided. A first one 14a of the tapered cantilever beam elements 14a-14n has the base 15a supported at a first edge 16a of the piezoelectric accelerometer sensor device 10 and has the tip portion 17a at a second edge 16b of the piezoelectric accelerometer sensor device 10. An immediately adjacent one 14b of the tapered cantilever beam elements 14a-14n is interdigitated with the first one 14a of the tapered cantilever beam elements 14a-14n, and which adjacent one 14b of the tapered cantilever beam elements 14a-14n has the base 15b supported on the second, opposing edge 16b of the piezoelectric accelerometer sensor device 10 and has the tip at the first edge 16a of the piezoelectric accelerometer sensor device 10.

Each of the tapered cantilever beam elements 14a-14n has its base 15a-15n portion supported on and attached to the respective one of the first 16a or second edges 16b of the piezoelectric accelerometer sensor device 10. Electrically conductive members (generally 20) are shown successively coupling alternating ones of the tapered cantilever beam elements 14a-14n, in an electrically series arrangement into one of a pair of groupings.

Figure 1A:
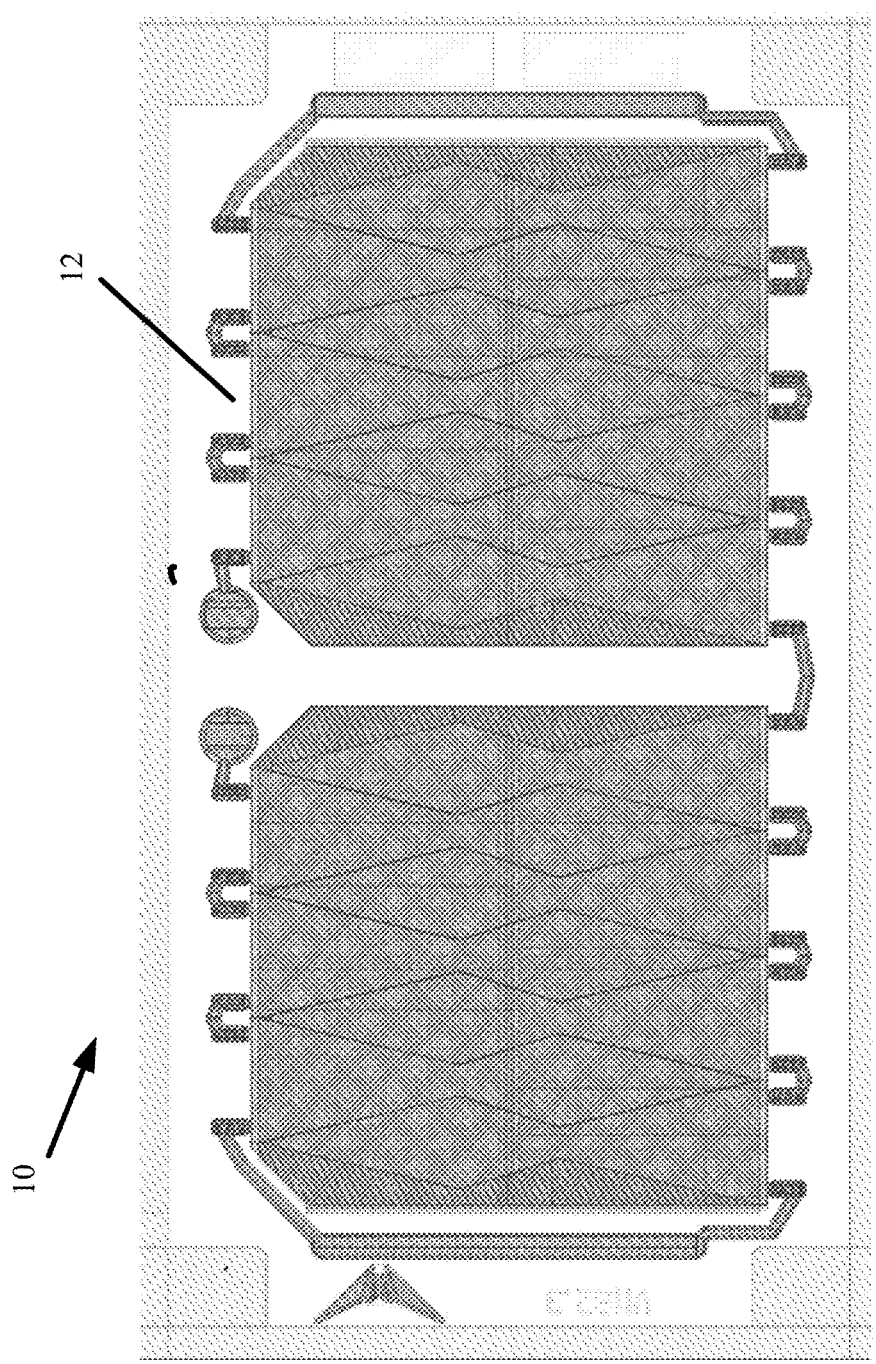

FIG. 1A shows a screen shot of the piezoelectric accelerometer sensor device 10 that includes the piezoelectric sensor element 12 as generally shown in FIG. 1.

Referring now to FIG. 2, the cantilever beam element 14a that is part of the piezoelectric sensor element 12 of the piezoelectric accelerometer sensor device 10 (FIG. 1) is shown. The cantilever beam element 14a is representative of each of the cantilever beam elements 14a-14n. The cantilever beam element 14a has a wide base region 15a attached to a silicon substrate 42, which base region 15a tapers to a narrow neck region 24a. The stress in this tapering region is approximately constant, and much higher than in the rest of the cantilever beam element 14a. The width of the cantilever beam element 14a expands starting at the neck region 24a to a wide region 26a, and from the wide region 26, tapers to a tapering region 28a and narrows to a rounded tip 17a. In some embodiments the cantilever beam element 14a-14n each have active regions 46a-46n and passive regions 48a-48b, as discussed below.

Referring now also to FIG. 2A, the cantilever beam element 14a is shown in cross-section. The cantilever beam element 14a includes a first conductive layer 30a disposed over a first piezoelectric layer 32a, a second conductive layer 34a disposed over a second piezoelectric layer 36a, and a third conductive layer 38a disposed over a spacer layer 40. The spacer layer 40 is on the substrate 42. The spacer layer 40 positions the cantilever beam 14a over the substrate 42 (which substrate 42 can be substantially removed beyond the part of the cantilever beam attached to the substrate), but not touching the substrate 42 in a quiescent state. The cantilever beam element 14a has a break 44a in the first conductive layer 30a, a break 44b in the second conductive layer 34a and a break 44c in the third conductive layer 38a disposed over a first spacer layer 40. The breaks 44a-44c are electrically isolating regions (e.g., removed portions of the respective conductive layers 30a, 34a and 38a), which may be filled in with piezoelectric layer portions 36a-36c. The breaks 44a-44c provide an active portion 46a of the cantilever beam element 14a and an inactive portion 48a of the cantilever beam element 14a. Similar active 46b-46n and inactive 48b-48n portions are provided for the other cantilever beam elements 14b-14n. (Alternatively, those inactive portions of the conductive layers need not be applied to the cantilever beam elements 14a-14n.)

Referring to FIG. 2B, an alternative configuration of FIG. 2A is shown with the substrate 42 portion substantially removed. The remaining features of FIG. 2B are as in FIG. 2A and need not be repeated here.

Referring to FIG. 3, an alternative cantilever beam element 14a' that could be an alternative implementation for all of the cantilever beam element 14a-14n (FIG. 1) for the piezoelectric sensor element 12 of the piezoelectric accelerometer sensor device 10 (FIG. 1) is shown. The cantilever beam element 14a' is similar to the cantilever beam element 14a of FIG. 2, having the wide base region 15a attached to a silicon substrate 42, which base region 15a tapers to a narrow neck region 24a. The stress in this tapering region is approximately constant, and much higher than that in the rest of the cantilever beam element 14a'. The width of the cantilever beam element 14a expands starting at the neck region 24a to a wide region 26a, and from the wide region 26, a tapering region 28a narrows to the rounded tip 17a. The cantilever beam element 14a' has a mass element 50 supported on conductive layer 30a. Other locations for the mass element 50 are feasible.

Referring now also to FIG. 3A, the cantilever beam element 14a' includes the first conductive layer 30a disposed over the first piezoelectric layer 32a, the second conductive layer 34a disposed over the second piezoelectric layer 36a, and the third conductive layer 38a disposed over the first spacer layer 40. The spacer layer 40 is on the substrate 42, as discussed above for FIG. 2A.

The cantilever beam element 14a' also has the break 44a in the first conductive layer 30a, the break 44b in the second conductive layer 34a and the break 44c in the third conductive layer 38a. The breaks 44a-44c are electrically isolating regions (e.g., removed portions of the respective conductive layers 30a, 34a, 38a), which may be filled in with piezoelectric layer portions 32a, 36a. The breaks 44a-44c provide the active portion 46a of the cantilever beam element 14a' and the inactive or passive portion 48a of the cantilever beam element 14a. (Similarly active and inactive portions are provided for the other cantilever beam elements (e.g., the cantilever beam elements 14b-14n, as illustrated for FIG. 1.)

In all material respects the cantilever beam element 14a' is the same as cantilever beam element 14a (FIG. 1) except that the cantilever beam element 14a' has the mass element 50 supported on conductive layer 30a in that portion of the conductive layer 30a that is part of the inactive portion 48a of the cantilever beam element 14a'.

Referring to FIG. 3B, an alternative configuration of FIG. 3A is shown with the substrate 42 portion substantially removed. The remaining features of FIG. 3B are as in FIG. 3A and need not be repeated here.

Referring to FIG. 3C, another alternative configuration of FIG. 3A is shown with the substrate 42 portion and spacer layers partially removed, leaving portions 40a, 40b of the spacer and portions 42a, 42b of the substrate. Portions 40a, 40b anchor the cantilever beam element 14a' whereas, portions 40b, 42b are attached to the bottom of the cantilever beam element but do not anchor the cantilever beam element 14a'. The remaining features of FIG. 3C are as in FIG. 3A and need not be repeated here.

Figure 3D:
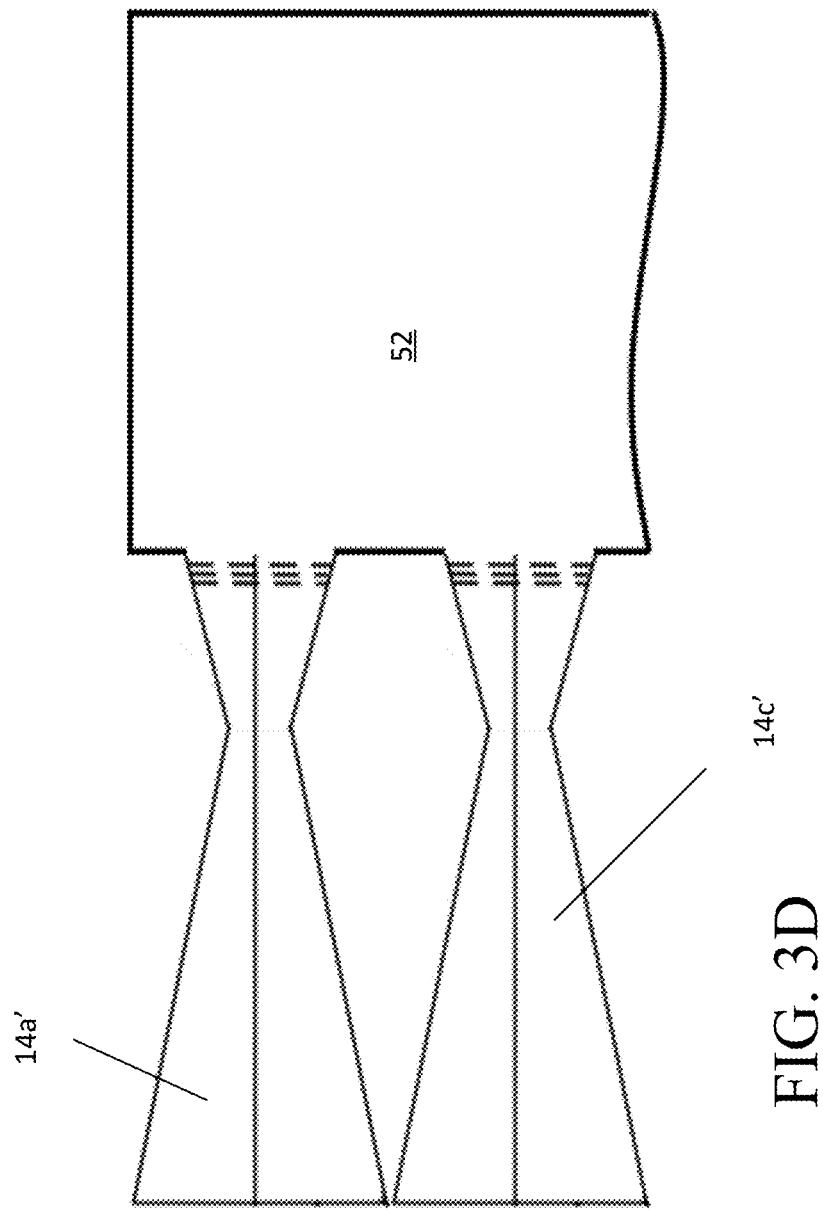
FIG. 3D is a plan view showing another alternative implementation.

Referring to FIG. 3D, another alternative configuration of FIG. 3A is shown with a single mass 52 over two cantilever beam elements 14a', 14c' as shown. In addition, the spacer and the substrate can be partially removed, leaving portions 40a, 40b of the spacer and portions 42a, 42b of the substrate. Portions 40a, 40b anchor the cantilever beam element 14a', 14c' whereas, portions 40b, 42b are attached to the bottom of the cantilever beam elements but do not anchor the cantilever beam elements. The cantilevers taper from their respective base portions. The free ends of the cantilevers are connected to one single mass 52. Although this view only shows two cantilevers, more could be used. The mass 52 a portion of the silicon substrate affixed to the bottom portions of the cantilever elements 14a' 14c'. The cantilever beam elements are not interdigitated. The remaining features of FIG. 3D are as in FIG. 3A, but without the cantilever beam elements 14b', 14d' etc., and need not be repeated here.

The piezoelectric accelerometer sensor device 10 with the piezoelectric sensor element 12 optimizes an output signal of the piezoelectric accelerometer sensor device 10 for a selected mechanical shock survivability limit.

In order to accomplish shock level optimization, the piezoelectric sensor element 12 optimizes stress distribution. This stress distribution optimization results from recognizing that the output signal that is optimized is not simply output voltage (or sensitivity), but is actually output energy (E), and that for a given acceleration level, the output energy (E) is defined as:

$$E = \frac{1}{2} \cdot C \cdot V^2$$

where C is the device capacitance and V is the output voltage.

Given that the output energy is proportional to $C \cdot V^2$ the piezoelectric accelerometer sensor device 10 has the piezoelectric sensor element 12 configured to distribute or spread, uniformly, a high stress level that could result from, e.g., a mechanical shock across a large surface area and thus avoid stress peaks that could cause the material of the piezoelectric sensor element 12 to fracture.

This uniform distribution of stress is provided by several mechanisms. One mechanism, as illustrated in FIGS. 2, 2A, 2B above, involves the tapered cantilever beams 14a-14n having active portions 46a-46n that are used in producing the electrical output signals from each of the cantilever beams 14a-14n resulting accelerations sensed by the piezoelectric sensor element 12, and passive portions 48a-48n that are electrically isolated from the active portions 46a-46n and, thus, have no role in producing the electrical output signals resulting from the piezoelectric sensor element 12 sensing acceleration, but which passive portions 48a-48n increase the mass of the tapered cantilever beams 14a-14n, as illustrated in FIGS. 2, 2A, 2B above.

Another mechanism, as illustrated in FIGS. 3, 3A-3D above, involves the tapered cantilever beam 14a' and (analogs of the cantilever beams 14b-14n as in FIG. 2) having the active portions 46a-46n from which electrical output signals are provided, and having the passive portions 48a-48n that are electrically isolated from the portions 46a-46n, and play no role in producing the electrical output signals resulting from the piezoelectric sensor element 12 sensing acceleration, but which passive portions 48a-48n each carry the added mass 50 at the tip portions of the tapered cantilever beams 14a-14n, and which further increases the mass of the tapered cantilever beams 14a-14n.

Another mechanism involves using a denser material at the tip end or the inactive portions of the tapered cantilever beams 14a-14n.

A uniform stress level can be provided by tapering a cantilever with a mass at the tip. In a cantilever of uniform width with a mass placed at its tip, the peak stress is located at the base and the stress gradually reduces from the base to the tip. By making the base wider than the tip, the stress in the material can be uniform across the entire structure. Further, these devices can be closely packed into a given area by interdigitating these tapered cantilever beams 14a-14n.

In general, these mechanisms are or can be used together. That is, the tapered cantilever beams 14a-14n have the active portions and the passive portions. The passive portions 48a-48n of the tapered cantilever beams 14a-14n carry the added mass, and in some embodiments, either the passive portions 48a-48n and/or the added mass are comprised of a thicker and/or more dense material than the active portions 46a-46n of the tapered cantilever beams 14a-14n. Using a more dense material can minimize the area supporting the added mass.

As more mass is added to ends of the tapered cantilever beams 14a-14n, the resonance frequency of the tapered cantilever beams 14a-14n decreases, and the mechanical stress in the material increases. It is desirable to minimize the area consumed by this added mass in order to maximize the area used for the active part of the sensor. Thus, as mentioned above, using a denser material than the active portion or a thicker material will tend to minimize the area used by the mass. In this way, a more complex process with additional layers can lead to improved performance for a given sensor area by increasing the mass density. For example, by adding a thick metal layer such as aluminum to the tip of the plates, the sensitivity can be increased. Another example would be adding a portion of the substrate (Si) to the non-active portion of the cantilever beam element 14a. Other examples are possible.

The tapered cantilever beams 14a-14n each are comprised of three electrode layers 30a, 34a, 38a sandwiching two piezoelectric layers 32a, 36a. In other embodiments, the tapered cantilever beams can be fewer than or more than fourteen cantilever beams. In other embodiments, the tapered cantilever beams can be comprised of more than three electrode layers sandwiching more than two piezoelectric layers, e.g., four electrode layers sandwiching three piezoelectric layers, etc.

Suitable materials for the electrodes layers include refractory metals such as molybdenum (Mo) titanium, vanadium, chromium, tungsten, zirconium, hafnium, ruthenium, rhodium, osmium and iridium, and metals such as platinum. Suitable piezoelectric materials include aluminum nitride (AlN). Other piezoelectric materials could be used, such as lead zirconate titanate (PZT). One specific combination is Mo and AlN, but Sc—AlN (Scandium-doped Aluminum nitride and PZT could be used in place of AlN). The electrodes have a discontinuity about half way down the length of the cantilever. This discontinuity separates the portion of the beam that electrically contributes to the output from that which does not. The portions that actively contribute to the output are referred to above as the active portions 46a-46n or active areas, and the portions that do not electrically contribute are referred to above as the passive 48a-48n or inactive portions or area.

The break between the active and inactive areas is along a line of constant stress (here, stress σ is defined as $\sigma=\sigma_{xx}+\sigma_{yy}$). The demarcation between active 46a-46n and inactive 48a-48n areas of the beam are the lines of constant stress that maximize the output energy (E) given by ($E=\frac{1}{2} \cdot C \cdot V^2$) for a given acceleration.

The fourteen cantilever beams 14a-14n are electrically connected in series via conductors to increase the output voltage generated by the piezoelectric sensor element 12 but at a lower capacitance for piezoelectric sensor element 12.

In an illustrative example of the piezoelectric sensor element 12, the piezoelectric sensor element 12 has fourteen cantilevers wired in series. In the embodiment, the piezoelectric sensor element 12 is comprised of Mo and AlScN and has an active length of 320 microns, an inactive length of 336 micron, and a width at its maximum width of 164 microns. The piezoelectric sensor element 12 has two piezoelectric material AlScN layers each having a thickness of 0.5 microns and the Mo conductors have a thickness of 20 nano-meters. The piezoelectric sensor element 12 of this example could produce an output voltage of approximately 1.6 mV/g (where g is gravitation acceleration) and a capacitance of approximately 1.27 pF. Of course, other examples could be used.

The piezoelectric sensor element 12 could provide an accelerometer 10 having a resonance frequency of approximately 3 kHz, giving the accelerometer 10 relatively more bandwidth of at least 1 kHz, than typical piezoelectric and/or capacitive based accelerometers, and thus such piezoelectric sensor element 12 could be used to provide a class of accelerometers commonly referred to as "voice accelerometers." In other embodiments the resonance frequency can be e.g., around 5 kHz.

These voice accelerometers, when placed into an earbud-style headset, sense voice by picking up the vibrations that are transmitted from the vocal chords, through the skull, to the headset while speaking. Typically, voice accelerometers are used to filter audio coming through a microphone or alone as voice pickup in noisy environments. Because the voice accelerometer is much less sensitive to external noise than a microphone, the voice accelerometer can be used to filter the microphone signal and reduce background noise.

The piezoelectric sensor element 12 used in the accelerometer 10 in combination with a low power wake-up circuit can provide a low-power wake-up voice accelerometer. As mentioned, this piezoelectric accelerometer outputs a voltage without a need for a bias voltage or bias charge. Therefore, it can be combined with low power circuitry and function as a wake-up for a low power headset with a voice interface.

Figure 4:
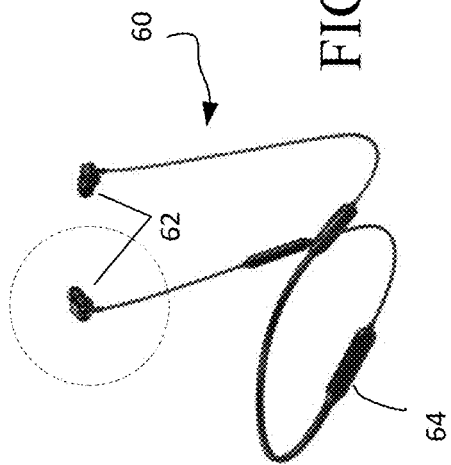
FIG. 4 is a diagrammatical view of an illustrative earbud headphone.

FIG. 4 shows an example of an earbud-style headset with ear buds (generally 62) that hold acoustic transducers and with a built in voice accelerometer (see FIG. 4A) and a package 64 that can contain volume, mute, answering, controls, etc. The style shown in FIG. 4 is exemplary, as any style can be used with the built in voice accelerometer. The earbud-style headsets are typically powered by a rechargeable battery, and include Bluetooth or other wireless technology. In particular these can be used in the true wireless stereo versions of earbuds.

Figure 4A:
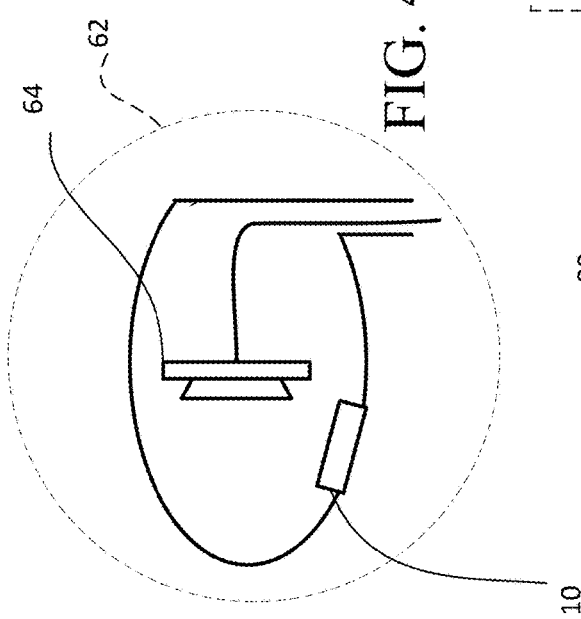
FIG. 4A is a blown up view of a portion of FIG. 4.

FIG. 4A shows a typical placement of the accelerometer 10, used as a voice accelerometer that substitutes for a built-in microphone in one of the earbuds 62 of the headset 60. The placement is configured to sense voice by picking up the vibrations transmitted from the vocal chords through the skull to the voice accelerometer in one (or both) of the earbuds 62 to the headset 60 while the user is speaking. In addition to the earbud 62, the earbud includes an acoustic transducer, e.g., speaker that is fed from an external circuit/device 64.

Figure 5:
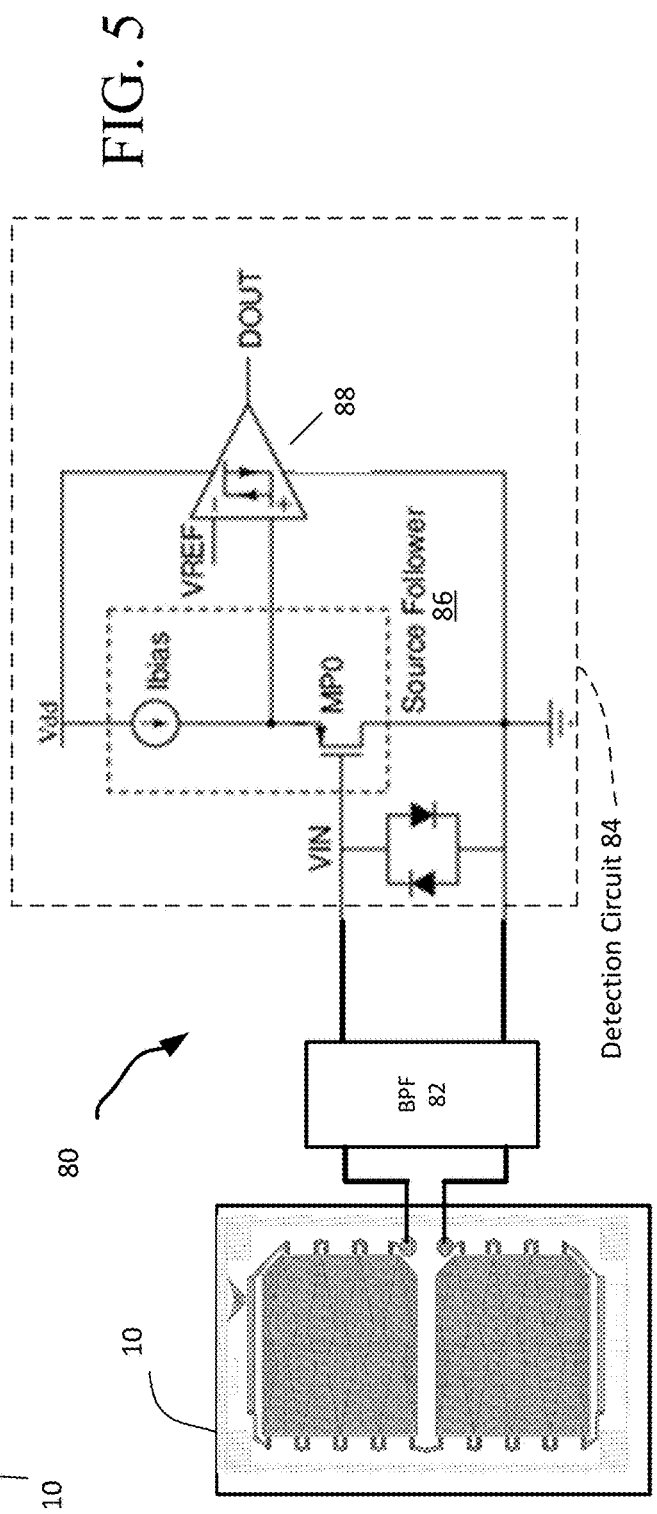
FIG. 5 is a voice accelerometer.

Referring now to FIG. 5, a low-power wake-up voice accelerometer 80 is shown. In order to provide a low-power wake-up voice accelerometer, a low power wake-up circuit 84 is coupled to receive an output signal from the voice accelerometer, as shown. The low-power wake-up voice accelerometer 80 includes the accelerometer 10 (FIG. 1, FIG. 1A) a reduced size version of FIG. 1A is shown, (the details are not explained nor need to be illustrated in FIG. 5. For such details the reader is referred to FIGS. 1-3A.

The output from accelerometer 10 is an output charge or voltage signal that is fed to a band pass filter BPF 82. For a low-power wake-up voice accelerometer application, the band pass filter 82 is used prior to comparing the signal from the accelerometer 10 to a threshold, to filter out effects caused from low frequency motion that would be sensed by the accelerometer and that would otherwise exceed the threshold. The output from the band pass filter 82 is fed to an input of the low power detection circuit 84.

The detection circuit 84 includes a source follower stage 86 that transforms charge generated by low-power wake-up voice accelerometer 80 (post band pass filtering from band pass filter 82), and provides gain to the band pass filtered signal for the next stage (e.g., a latched comparator stage) 88. The latched comparator 88 includes a latch comparator and is used to compare the output of the source follower 86 stage to a reference voltage that is chosen to target a specific minimum acceleration level. Once this level has been sensed, the latched comparator 88 latches the event, and provides a signal indicating such. The latched comparator uses positive feedback to effectively act as a memory cell.

In a variation, latched comparator 88 is configured to detect when the acoustic input (or VIN) satisfies one or more specified criteria. There are various types of criteria that the detection circuit 80 can be configured to detect. These criteria include, e.g., voice criteria (detection of voice), keyword criteria (e.g., detection of keywords), ultrasonic criteria (e.g., detection of ultrasonic activity in proximity to our surrounding the transducer or acoustic device), criteria of detecting footsteps, mechanical vibrations/resonances, gunshots, breaking glass, and so forth.

In this example, a bandwidth of the preamplifier stage (e.g., implemented by the preamplifier) determines a spectrum of input signals that trigger the comparator stage implemented by the latched comparator 88. Ultra-Low Power electronics typically have bandwidths still acceptable for the audio range. Also, impulse events trigger a broad spectrum increase in energy, acceptable for triggering with the comparator.

Figure 6:
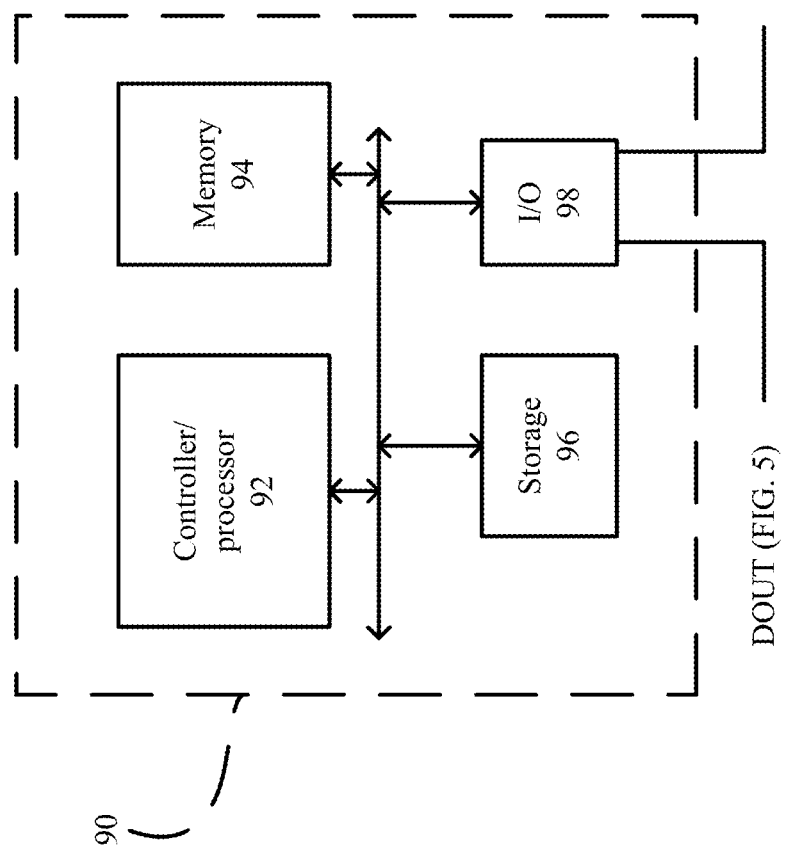
FIG. 6 is a block diagram of an embedded processing device.

Once power is removed from the latched comparator, the information that was latched is cleared or lost, while memory, e.g., static random access memory (SRAM) FIG. 6, retains the information even with the power removed. This signal DOUT is an output signal that is used for detection of a signal at the requisite vibration level and, thus, used as a wake-up signal for a voice accelerometer. This signal can be further used to control/trigger other events within an application specific integrated circuit (ASIC) or within an overall system by using this signal as an input to another system/device.

Referring now to FIG. 6, an example of an embedded processing device 90 that can be used to process output DOUT (FIG. 5) includes a processor/controller 92 that can be an embedded processor, a central processing unit or fabricated as an ASIC (application specific integrated circuit), etc. The processing device 90 also includes memory 94, storage 96 and I/O (input/output) circuitry 98, all of which are coupled to the processor/controller 92 via a bus 99. The I/O circuitry 98, e.g., receives the digitized output signal DO, processes that signal and generates a subsequent output that can be a wake-up signal or other signal, as appropriate for external circuitry.

In some implementations, the processing device 90 performs the function of a threshold detector to detect when an acoustic input to the voice accelerometer equals or exceeds a threshold level, e.g., by detecting when the DO equals or exceeds an amplitude level or is within a frequency band. Because in such an implementation detection is performed by the processing device 90, rather than being included in the acoustic device, e.g., hybrid integrated voice accelerometer, the processing device 90 needs to remain powered on to detect the audio stimulus.

Figure 7:
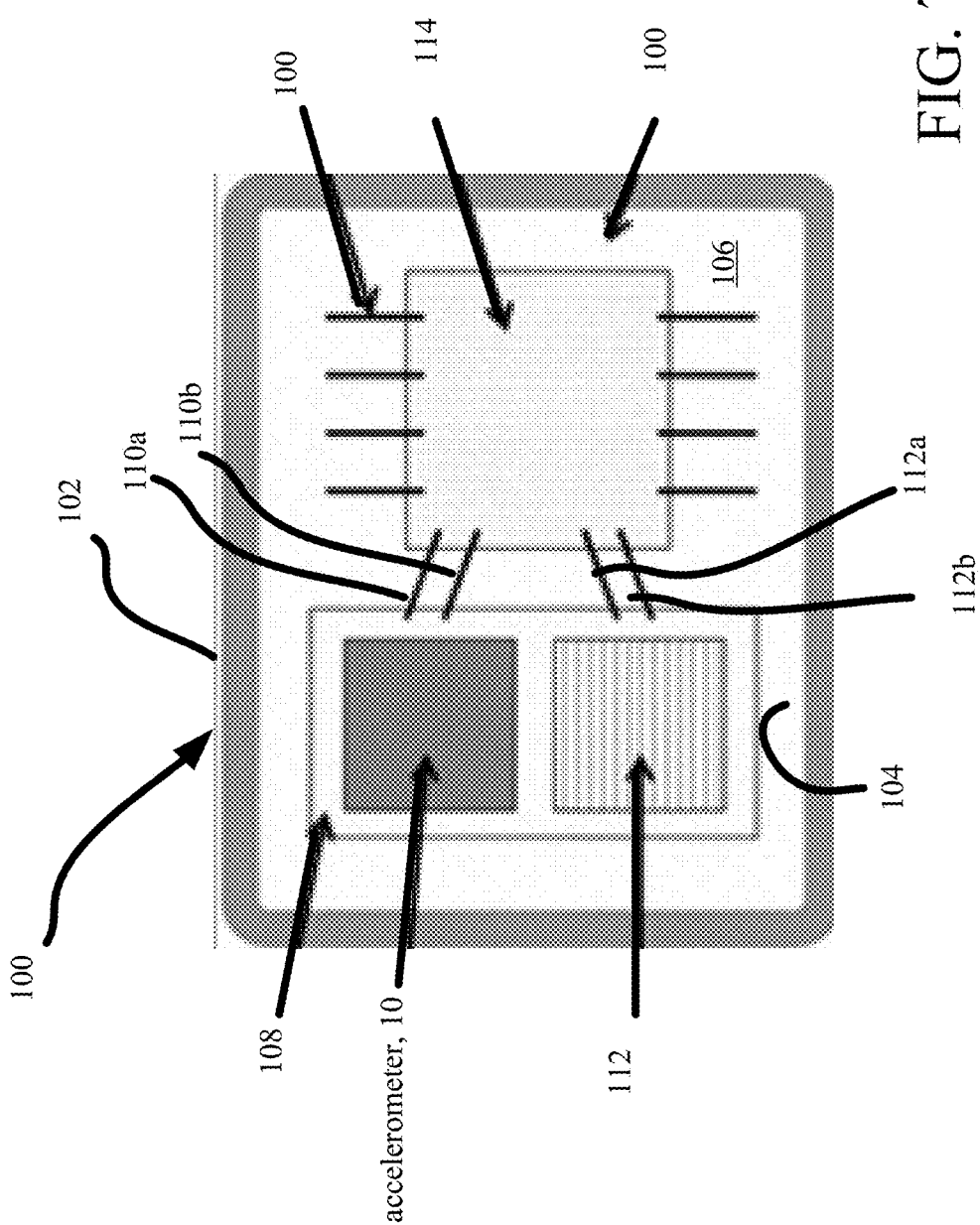
FIG. 7 is a diagram of a packaged MEMS device.

Referring now to FIG. 7, an illustrative example of a packaged MEMS device 100 is shown. The MEMS device 100 includes a package 102 having a compartment 104 in which is a circuit board 106 that supports a MEMS die 108 having the accelerometer 10 configured to provide a voice accelerometer and a MEMS microphone 112 provided on a MEMS die 108. Both the accelerometer 10 and the MEMS microphone 112 are connected to an application specific integrated circuit (ASIC) 114.

The ASIC 114 functions to combine output signals from the MEMS accelerometer 10 and the MEMS microphone 112 into a single, combined output signal. The MEMS accelerometer 10 and the MEMS microphone 112 are coupled to the (ASIC) 114, for example, by wire bonds 110a, 110b and 112a, 112b, as shown. Also shown are other wire bonds (not referenced) that can be coupled to other circuit elements such as device circuitry of a device (not shown) that would incorporate the MEMS device 100, as well as power connections, etc.

As mentioned above, the voice accelerometer signal is often combined with a microphone signal in order to provide a lower noise representation of a user's voice. Some of the unique aspects of the accelerometer 10 that makes it ideally suitable for such an application include that the accelerometer 10 is fabricated by the same process as the microphone 112, while, at the same time, the accelerometer 10 is relatively insensitive to dust particles, etc., compared to an equivalent capacitive accelerometer.

The accelerometer 10 can be built on the same MEMS die and packaged in the same MEMS package as the MEMS microphone 112. Furthermore, the accelerometer 10 and the MEMS microphone 112 can share the same ASIC that combine the signals from the microphone and the accelerometer into a single representation of the user's voice.

Figure 8:
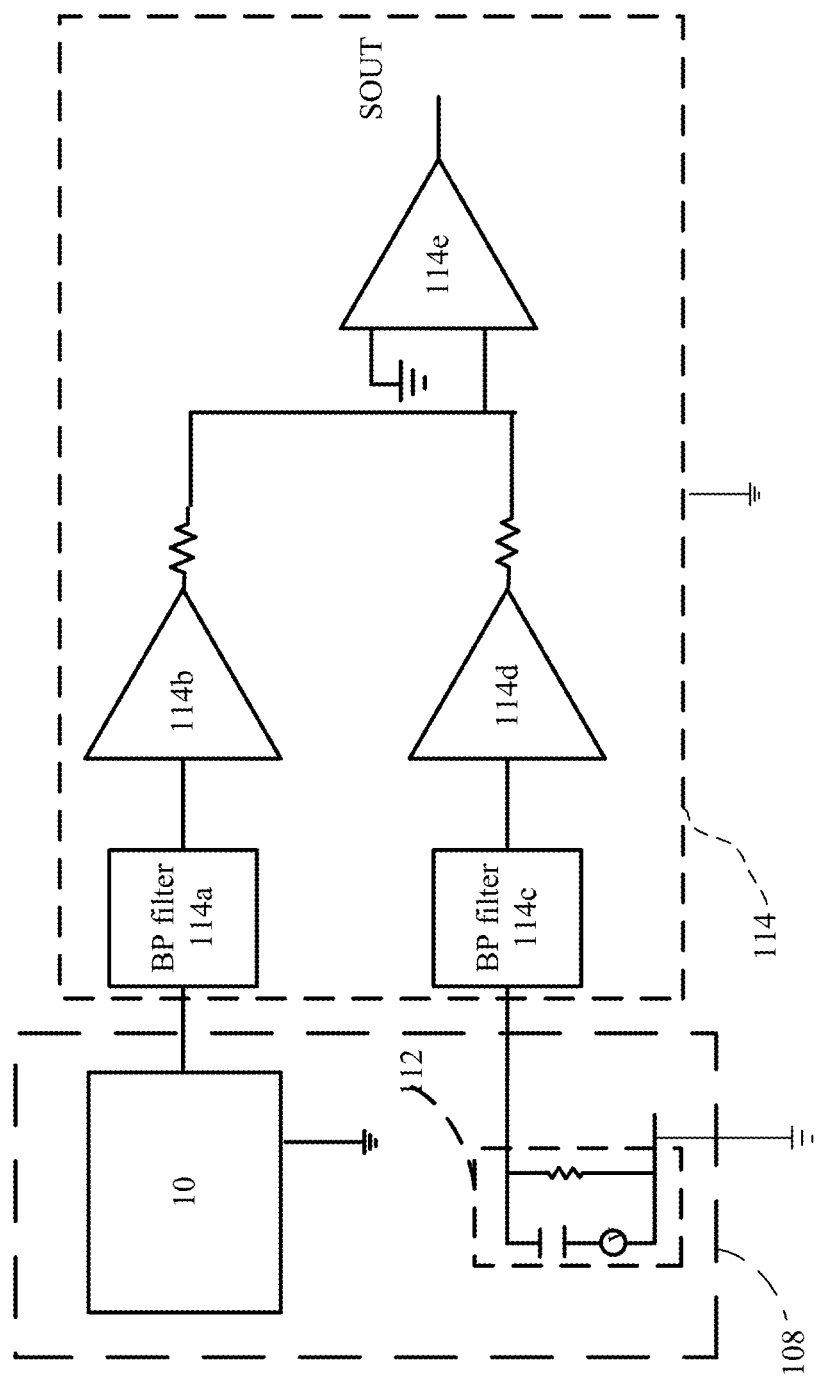
FIG. 8 is a block diagram of a ASIC useful in the MEMS device of FIG. 7.

Referring now to FIG. 8, aspects of the ASIC 114 are shown. Salient features of the ASIC 114 include, for example, a band-pass filter 114a that is coupled to the output of the accelerometer 10 and which band-pass filter 114a has cut-off or −3 dB frequencies of, for example, 100 Hz and 2000 Hz. The band-pass filter 114a has its output coupled to an amplifier 114b that provides an appropriate amount of signal gain to the signal from the band-pass filter 114a. The ASIC 114 also includes, for example, a band-pass filter 114c that is coupled to the output of the MEMS microphone 112 and which band-pass filter 114c has cut-off or −3 dB frequencies of, for example, 2000 Hz and 8000 Hz. The band-pass filter 114c has its output coupled to an amplifier 114d that provides an appropriate amount of signal gain to the signal from the band-pass filter 114c.

The outputs from the amplifier 114b and the amplifier 114d are combined, e.g., these signals could be coupled to a third amplifier 114e that combines these output signals into a single output signal ($S_{out}$) that represents a user's voice. Other approaches could be used.

The MEMS device 100 has the accelerometer 10 fabricated by the same process as the microphone 112a. The MEMS device 100 is packaged in a single package that houses both the accelerometer 10 (that has a relatively high resonance frequency and optimized to withstand relatively high mechanical shock levels) and the microphone 112, and which share the same MEMS die 108. This MEMS device 100 can sense both acceleration and sound produced by a user's voice, and thus improve the quality of a signal representative of the user's voice, as the accelerometer 10 is acting as a voice accelerometer.

The MEMS device 100 that has the voice accelerometer 10 can be fabricated by the same process as the microphone 112a, but does not necessarily need to combine their respective signals. For example, the MEMS device 100 could have, for example, separate amplifier stages for the voice accelerometer 10 and the microphone 112a, or the MEMS device 100 could use the voice accelerometer 10 for wake-up and use the microphone signal output for voice. Therefore, the MEMS device 100 could have two outputs, one for the voice accelerometer 10 and the microphone 112a. For example, the MEMS device 100 can be part of a remote control with the MEMS accelerometer 10 used to determine if the remote control has been picked up and the MEMS microphone 112a used for voice commands. A similar arrangement/use can be provide if the MEMS device 100 is used in a smartphone, etc.

A number of embodiments of the invention have been described. Nevertheless, it will be understood that various modifications may be made without departing from the spirit and scope of the invention. Accordingly, other embodiments are within the scope of the following claims.

What is claimed is:

1. A sensor device, comprises:
   a substrate;
   a spacer layer supported over a first surface of the substrate; and a first tapered cantilever beam element comprising:
   a base portion and a tip portion, the base portion attached to the spacer layer, wherein the first tapered cantilever beam element is supported over and spaced from the substrate by the spacer layer, and wherein the first tapered cantilever beam element is configured to have the base portion taper to an intermediate neck region, and from the intermediate neck region expand to a wide intermediate region, and from the wide intermediate region taper to the tip portion;
   at least a first layer comprised of a piezoelectric material; and
   a pair of electrically conductive layers disposed on opposing surfaces of the first layer, wherein the pair of electrically conductive layers has an electrical discontinuity to provide an electrically active portion of the first tapered cantilever beam element and an electrically inactive portion of the first tapered cantilever beam element.

2. The sensor device of claim 1, wherein the piezoelectric material is aluminum nitride, or lead zirconate titanate, or scandium-doped aluminum nitride.

3. The sensor device of claim 1, wherein the substrate is silicon, the spacer layer is silicon dioxide, and the pair of electrically conductive layers are comprised of a refractory metal.

4. The sensor device of claim 1, wherein the first layer of piezoelectric material and the pair of electrically conductive layers are part of a plurality of layers of piezoelectric material and a plurality of pairs of electrically conductive layers disposed on opposing surfaces of the plurality of layers of piezoelectric material, and which the plurality of layers of piezoelectric material and the plurality of pairs of electrically conductive layers are arranged in a stack.

5. The sensor device of claim 1, further comprising:
   a plurality of tapered cantilever beam elements that includes the first tapered cantilever beam element; and
   a plurality of mass elements supported at tip portions of the plurality of tapered cantilever beam elements wherein each mass element of the plurality of mass elements is supported on respective electrically inactive portions of the plurality of tapered cantilever beam elements.

6. The sensor device of claim 1, wherein the first tapered cantilever beam element is part of a plurality of tapered cantilever beam elements arranged in a close-packed area by interdigitating the plurality of tapered cantilever beam elements, with each of the plurality of tapered cantilever beam elements including a layer of the piezoelectric material and having a pair of electrically conductive layers disposed on opposing surfaces of the layer of the piezoelectric material.

7. The sensor device of claim 6, wherein each of the plurality of tapered cantilever beam elements has an electrical discontinuity in at least one of the pair of electrically conductive layers to provide an associated electrically active portion and an associated electrically inactive portion.

8. The sensor device of claim 7, wherein each of the plurality of tapered cantilever beam elements has a mass element, with the mass element supported on the electrically inactive portion of the plurality of tapered cantilever beam elements.

9. The sensor device of claim 1, further comprising:
   a plurality of tapered cantilever beam elements that includes the first tapered cantilever beam element; and
   a single mass supported on a corresponding electrically inactive portion of each of the plurality of tapered cantilever beam elements.

10. The sensor device of claim 1, wherein the first tapered cantilever beam element has the base portion as a wide base portion attached to the spacer layer.

11. The sensor device of claim 6, wherein each of the plurality of tapered cantilever beam elements has a wide base portion attached to the spacer layer.

12. The sensor device of claim 1, further comprising:
   a plurality of tapered cantilever beam elements including the first tapered cantilever beam element, with the plurality of tapered cantilever beam elements arranged in a close-packed area, and with each of the plurality of tapered cantilever beam elements comprising at least the first layer of piezoelectric material, the pair of electrically conductive layers; and each further including a mass supported at the tip portion of each of the plurality of tapered cantilever beam elements.

13. The sensor device of claim 12, wherein each of the plurality of tapered cantilever beam elements has a wide base region that is attached to the spacer layer.

14. The sensor device of claim 6, wherein the plurality of tapered cantilever beam elements are electrically connected in series.

15. The sensor device of claim 1, wherein the sensor device has a bandwidth of at least 1 kHz up to 5 kHz to produce an output signal.

16. The sensor device of claim 15, wherein the piezoelectric material is aluminum nitride or lead zirconate titanate or scandium-doped aluminum nitride, and the substrate being silicon, the spacer layer being silicon dioxide and the pair of electrically conductive layers comprised of a refractory metal.

17. The sensor device of claim 15, wherein the first tapered cantilever beam element tapers in width from the base portion to the tip portion.

18. The sensor device of claim 17, wherein the first layer of piezoelectric material and the pair of electrically conductive layers are part of a plurality of layers of piezoelectric material and a plurality of pairs of electrically conductive layers disposed on opposing surfaces of the plurality of layers of piezoelectric material, and which the plurality of layers of piezoelectric material and the plurality of pairs of electrically conductive layers are arranged in a stack.

19. A sensor device, comprising:
   a substrate;
   a spacer layer supported over a first surface of the substrate; and
   a first tapered cantilever beam element having a base portion and a tip portion, the base portion attached to the spacer layer, and which the first tapered cantilever beam element is supported over and spaced from the substrate by the spacer layer, with the first tapered cantilever beam element configured to have the base portion taper to an intermediate neck region, and from the intermediate neck region expand to a wide intermediate region, and from the wide intermediate region taper to the tip portion, and with the first tapered cantilever beam element further comprising: at least a first layer comprised of a piezoelectric material, and a pair of electrically conductive layers disposed on opposing surfaces of the first layer;
   wherein the first tapered cantilever beam element has an electrical discontinuity in at least one of the pair of electrically conductive layers to provide an electrically active portion of the first tapered cantilever beam element and an electrically inactive portion of the first tapered cantilever beam element.

20. The sensor device of claim 19, further comprising:
a mass supported at the tip portion of the first tapered cantilever beam element, with the mass supported on the electrically inactive portion of the first tapered cantilever beam element.

21. A sensor device, comprising:
a substrate;
a spacer layer supported over a first surface of the substrate; and
a first tapered cantilever beam element comprising:
    a base portion and a tip portion, the base portion attached to the spacer layer, and which the first tapered cantilever beam element is supported over and spaced from the substrate by the spacer layer, with the first tapered cantilever beam element having the base portion taper to an intermediate neck region, and from the intermediate neck region expand to a wide intermediate region, and from the wide intermediate region taper to the tip portion;
    at least a first layer comprised of a piezoelectric material;
    and a pair of electrically conductive layers disposed on opposing surfaces of the first layer;
wherein the first tapered cantilever beam element is one of a plurality of tapered cantilever beam elements arranged in a close-packed area by interdigitating the plurality of tapered cantilever beam elements, and with each of the plurality of tapered cantilever beam elements having an electrical discontinuity in at least one of a respective pair of electrically conductive layers to provide an electrically active portion and an electrically inactive portion.

22. The sensor device of claim 21, wherein each of the plurality of tapered cantilever beam elements has a mass element supported on the electrically inactive portion of each tapered cantilever beam element.

\* \* \* \* \*